(12) United States Patent
Tuncer

(10) Patent No.: US 10,998,256 B2
(45) Date of Patent: May 4, 2021

(54) HIGH VOLTAGE SEMICONDUCTOR DEVICE LEAD FRAME AND METHOD OF FABRICATION

(71) Applicant: TEXAS INSTRUMENTS INCORPORATED, Dallas, TX (US)

(72) Inventor: Enis Tuncer, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/533,566

(22) Filed: Aug. 6, 2019

(65) Prior Publication Data

US 2020/0211940 A1 Jul. 2, 2020

Related U.S. Application Data

(60) Provisional application No. 62/786,838, filed on Dec. 31, 2018.

(51) Int. Cl.
| | | |
|---|---|---|
| *H01L 23/495* | (2006.01) | |
| *H01L 23/00* | (2006.01) | |
| *H01L 23/31* | (2006.01) | |
| *H01L 21/48* | (2006.01) | |
| *H01L 25/00* | (2006.01) | |
| *H01L 25/065* | (2006.01) | |

(52) U.S. Cl.
CPC .... *H01L 23/49575* (2013.01); *H01L 21/4821* (2013.01); *H01L 23/3121* (2013.01); *H01L 23/49503* (2013.01); *H01L 23/49541* (2013.01); *H01L 24/48* (2013.01); *H01L 24/49* (2013.01); *H01L 25/0655* (2013.01); *H01L 25/50* (2013.01); *H01L 21/4828* (2013.01); *H01L 21/4842* (2013.01); *H01L 24/32* (2013.01); *H01L 24/73* (2013.01); *H01L 2224/32245* (2013.01); *H01L 2224/48137* (2013.01); *H01L 2224/48245* (2013.01); *H01L 2224/49175* (2013.01); *H01L 2224/73265* (2013.01)

(58) Field of Classification Search
CPC ............... H01L 23/49541; H01L 23/49503
USPC .......................................................... 257/676
See application file for complete search history.

(56) References Cited

U.S. PATENT DOCUMENTS 7,728,414 B2 * 6/2010 Omori ................... H01L 21/565
257/676
7,838,974 B2 * 11/2010 Poddar ................... H01L 24/32
257/676

(Continued)

FOREIGN PATENT DOCUMENTS

WO WO-2008093586 A1 * 8/2008 ........... H01L 21/565

*Primary Examiner* — Victoria K. Hall
(74) *Attorney, Agent, or Firm* — Dawn Jos; Charles A. Brill; Frank D. Cimino

(57) ABSTRACT

An apparatus includes a first die attach pad and a second die attach pad. A first die is attached to the first die attach pad and a second die is attached to the second die attach pad. The first die attach pad and the second die attach pad are separated by a gap. A first edge of the first die attach pad adjacent to the gap is thinner than a second edge of the first die attach pad. The first edge of the first die attach pad is opposite the second edge of the first die attach pad. A first edge of the second die attach pad adjacent to the gap is thinner than a second edge of the second die attach pad. The first edge of the second die attach pad is opposite the second edge of the second die attach pad.

17 Claims, 15 Drawing Sheets

(56) References Cited

U.S. PATENT DOCUMENTS

| | | | |
|---|---|---|---|
| 7,944,030 B2* | 5/2011 | Mikami | H01L 24/48 257/666 |
| 8,138,598 B2* | 3/2012 | Shiraishi | H02M 7/003 257/723 |
| 8,637,892 B2* | 1/2014 | Egoshi | H01L 24/97 257/99 |
| 10,083,896 B1* | 9/2018 | Zhang | H01L 23/49541 |
| 10,777,489 B2* | 9/2020 | Urushihata | H01L 23/49562 |
| 10,847,385 B2* | 11/2020 | Tanwongwan | H01L 21/4825 |
| 2010/0117225 A1* | 5/2010 | Shiraishi | H01L 24/06 257/723 |
| 2011/0186902 A1* | 8/2011 | Egoshi | H01L 24/97 257/99 |
| 2014/0264806 A1* | 9/2014 | Arbuthnot | H01L 24/83 257/676 |
| 2014/0312514 A1* | 10/2014 | Yasunaga | H01L 23/3731 257/782 |
| 2014/0353814 A1* | 12/2014 | Sakamoto | H01L 23/49568 257/712 |
| 2016/0300782 A1* | 10/2016 | Chen | H01L 23/3114 |
| 2017/0110389 A1* | 4/2017 | Hayashi | H01L 23/3114 |
| 2017/0317036 A1* | 11/2017 | Myers | H01L 23/562 |
| 2018/0366346 A1* | 12/2018 | Mori | H01L 29/872 |
| 2020/0075441 A1* | 3/2020 | Kim | H01L 23/49541 |
| 2020/0211934 A1* | 7/2020 | Ko | H01L 24/49 |
| 2020/0211940 A1* | 7/2020 | Tuncer | H01L 23/49503 |
| 2020/0273813 A1* | 8/2020 | Daryl Wee | H01L 23/49513 |

* cited by examiner

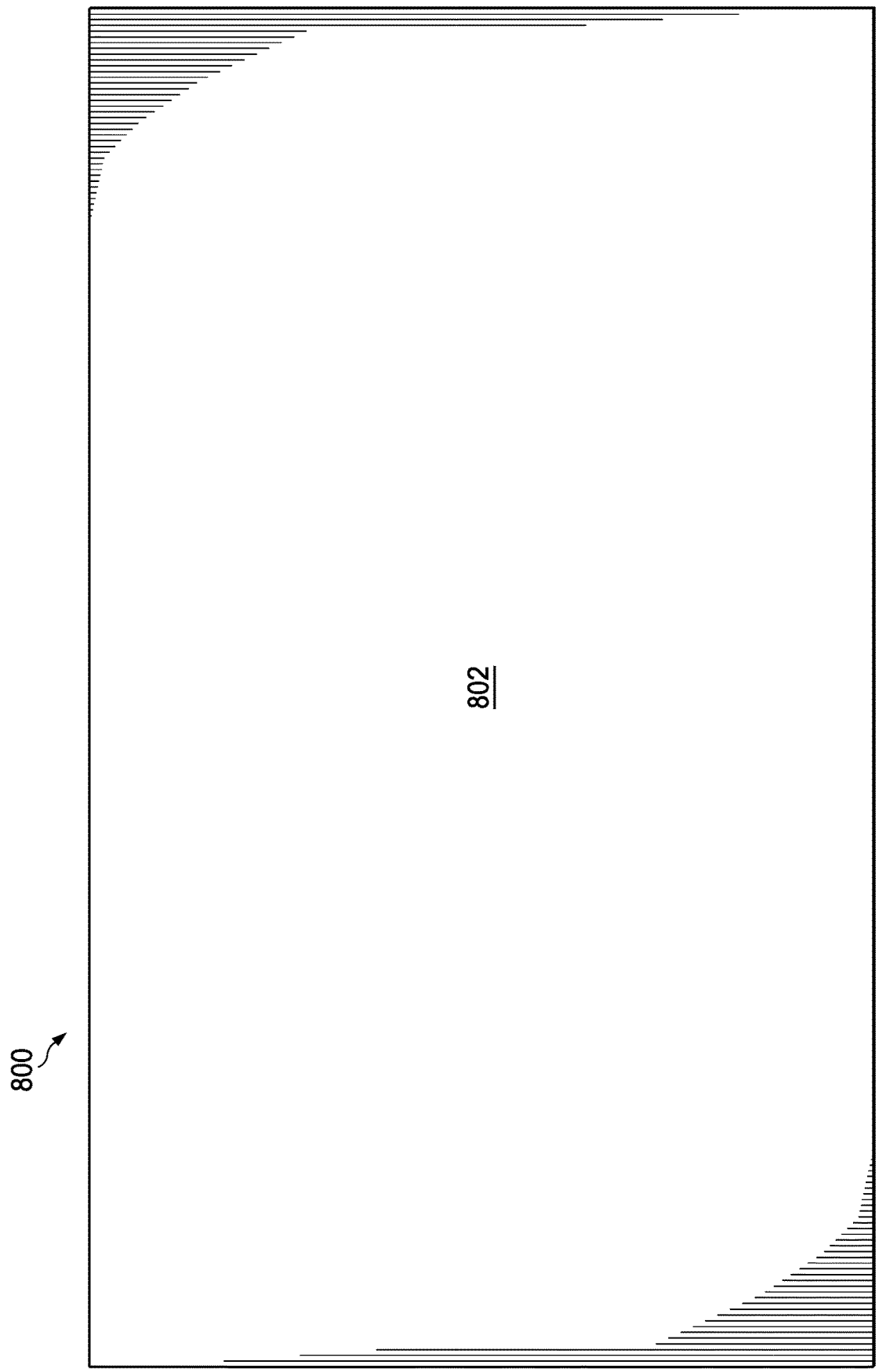

US 10,998,256 B2

HIGH VOLTAGE SEMICONDUCTOR DEVICE LEAD FRAME AND METHOD OF FABRICATION

PRIORITY

This application claims the benefit of U.S. provisional patent application No. 62/786,838, which was filed on Dec. 31, 2018 and is entitled "High Voltage Semiconductor Device Lead Frame and Method of Fabrication."

BACKGROUND

Electrical field leakage out of a semiconductor package may cause device failure. As semiconductor packages are made smaller or higher voltage semiconductor devices are included in such packages, electric field leakage may be increased.

SUMMARY

An apparatus includes a first die attach pad and a second die attach pad. The first die attach pad and the second die attach pad are separated by a gap. A first portion of the gap and a second portion of the gap are wider than an intermediate portion of the gap. The apparatus further includes a die bonded to the first die attach pad. The apparatus further includes a second die bonded to the second die attach pad.

A method includes removing metal from a lead frame to form a gap between a first die attach pad of the lead frame and a second die attach pad of the lead frame. The method further includes removing metal from the first die attach pad and the second die attach pad at a first end of gap so that the first end of the gap is wider than an intermediate portion of the gap. The method further includes removing metal from the first die attach pad and the second die attach pad at a second end of the gap so that a second end of the gap is wider than the intermediate portion of the gap. The method further includes attaching a first die to the first die attach pad and attaching a second die to the second die attach pad.

A computer readable storage device stores instructions executable by one or more processors to initiate removal of metal from a lead frame to form a gap between a first die attach pad of the lead frame and a second die attach pad of the lead frame. The instructions are further executable by the one or more processors to initiate removal of metal from the first die attach pad and the second die attach pad at a first end of gap so that the first end of the gap is wider than an intermediate portion of the gap. The instructions are further executable by the one or more processors to initiate removal of metal from the first die attach pad and the second die attach pad at a second end of the gap so that a second end of the gap is wider than the intermediate portion of the gap. The instructions are further executable by the one or more processors to initiate attachment of a first die to the first die attach pad and attachment of a second die to the second die attach pad.

BRIEF DESCRIPTION OF THE DRAWINGS

For a detailed description of various examples, reference will now be made to the accompanying drawings in which:

FIG. 8 is a diagram depicting a first stage of a process of manufacturing a package for high voltage semiconductor devices.

DETAILED DESCRIPTION

Packages for high voltage semiconductor devices and methods of manufacturing such packages are described herein.

Figure 1:
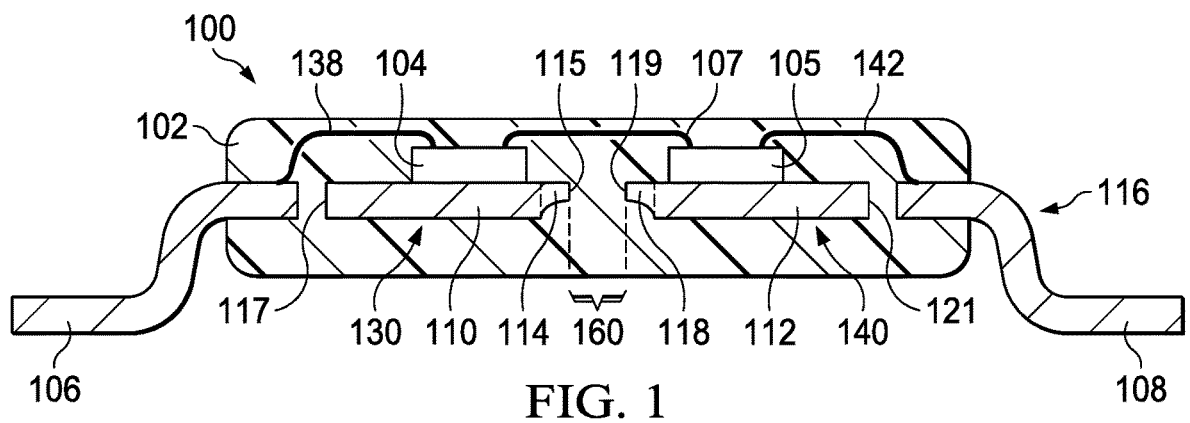
FIG. 1 is a diagram of a cross section of a package for high voltage semiconductor devices.

Referring to FIG. 1, a diagram illustrating a cross section of a package 100 for high voltage semiconductor devices is shown. The package 100 may correspond to an isolation device that includes semiconductor dies configured to operate at different voltages. In the illustrated example, the package 100 includes mold compound 102, a first semiconductor die 104, a second semiconductor die 105, and a lead frame 116. The mold compound 102 may include epoxy resin, silicas, other components, or a combination thereof. In some examples, a voltage difference between the first semiconductor die 104 and the second semiconductor device 105 is 6 kilovolts (kV). In other examples, a voltage difference between the first semiconductor die 104 and the second semiconductor device 105 is 8 kV. Examples of material included in the lead frame 116 include copper (Cu), copper alloy, and other conductive materials.

In the illustrated example, the lead frame 116 includes a first pin 106 (e.g., a first lead), a second pin 108 (e.g., a second lead), a first die attach pad 130, and a second die attach pad 140. The semiconductor dies 104, 105 may be attached to the die attach pads 130, 140 using a conductive or insulating adhesive. The first semiconductor die 104 is coupled to the first pin 106 via a first wire bond 138. The second semiconductor die 105 is coupled to the second pin 108 via a second wire bond 142. The semiconductor dies 104, 105 are coupled (e.g., electrically coupled) to each other via a third wire bond 107. A gap 160 is located between the die attach pads 130, 140. The mold compound 102 covers portions of the first semiconductor die 104, the second semiconductor die 105, the first die attach pad 130, the second die attach pad 140, the first pin 106, and the second pin 108.

A first portion 114 of the first die attach pad 130 located adjacent to the gap 160 has a first edge 115 and is thinned relative to a second portion 110 of the first die attach pad 130. Accordingly, the first edge 115 of the first die attach pad 130 is thinner than a second edge 117 of the first die attach pad 130 that is opposite the first edge 115 of the first die attach pad 130. Similarly, a first portion 118 of the second die attach pad 140 located adjacent to the gap 160 has a first edge 119 and is thinned relative to a second portion 112 of the second die attach pad 140. Accordingly, the first edge 119 of the second die attach pad 140 is thinner than a second edge 121 of the second die attach pad 140 that is opposite the first edge 119 of the second die attach pad 140. The relatively thinner first edges 115, 119 face each other across the gap 160. Accordingly, density of metal between opposite voltages of the semiconductor dies 104, 105 within the package 100 may be less as compared to other packages in which the die attach pads 130, 140 have uniform thicknesses. In the illustrated example, the first edge 115 of the first die attach pad 110 has a thickness that is 50% a thickness of the second edge 117 of the first die attach pad 130. Similarly, the first edge 119 of the second die attach pad 140 has a thickness that is 50% a thickness of the second edge 121 of the second die attach pad 140.

In operation, the semiconductor dies 104, 105 attached to the die attach pads 130, 140 generate a three dimensional electric field. A volume of the electric field is influenced by a difference in voltage between the semiconductor dies 104, 105. Further, the volume of the electric field is influenced by a density of metal (including that of the die attach pads 130, 140) between the two voltages. In general, the less dense the metal in a volume between the two voltages is, the smaller the electric field volume may be for a given voltage difference. On the other hand, the larger the voltage difference is, the larger the electric field volume may be. Because the first portion 114 (and the first edge 115) of the first die attach pad 130 and the first portion 118 (and the first edge 119) of the second die attach pad 140 are thinned, density of metal between voltages generated by devices attached to the die attach pads 130, 140 may be less as compared to in packages in which the die attach pads 130, 140 have uniform thickness. Accordingly, an electric field generated by semiconductor devices included in the package 100 may have a smaller volume as compared to electric fields generated by similar semiconductor devices in other packages. Greater thinning of the portions 114, 118 may result in smaller electric field volumes. Accordingly, thickness of the portions 114, 118 (and the edges 115, 119) may be selected by a semiconductor manufacturer based on a voltage difference of semiconductor devices included in the package 100 so that the electric field of the semiconductor devices does not leak out of the package 100.

It should be noted that packages that include lead frames with thinned edges may be configured differently than shown in FIG. 1. For example, lead frames that include thinned edges may be deployed in different types of packages, such as quad flat no-lead (QFN) packages or other types of packages. Further, packages may include different connections or different materials than shown.

Figure 2:
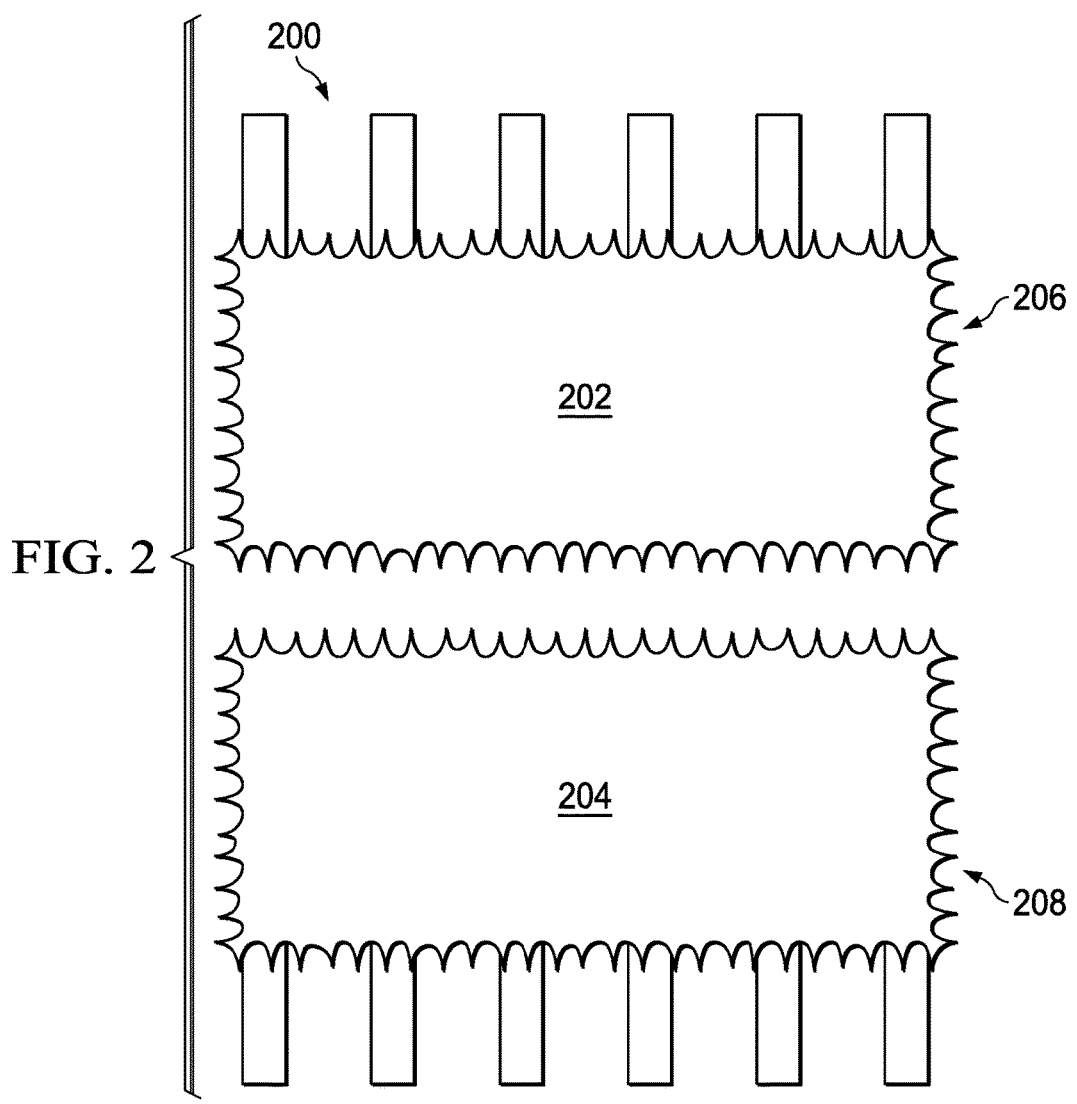
FIG. 2 is a diagram illustrating a lead frame for use with high voltage semiconductor devices.

Referring to FIG. 2, a diagram illustrating another lead frame 200 for use with high voltage semiconductor devices is shown. The lead frame 200 includes a first die attach pad 202 and a second die attach pad 204. As illustrated, edges of the first die attach pad 202 and the second die attach pad 204 are staggered. In particular, the first die attach pad 202 includes protrusions 206 the second die attach pad 204 includes protrusions 208. Staggering the edges of the die attach pads 202, 204 may decrease density of metal between opposing edges of the die attach pads 202, 204 that are at opposite voltages. Accordingly, the lead frame 200 may be used in a package to decrease a volume of an electric field generated by semiconductor dies. Therefore, the lead frame 200 may prevent an electric field of a high voltage device from leaking outside of a package. While each illustrated as including 4 staggered edges, in some examples, the die attach pads 202, 204 include one staggered edge each, in other implementations the die attach pads 202, 204 include a different number of staggered edges. For example, opposing edges of the die attach pads 202, 204 may be staggered while other edges of the die attach pads 202, 204 are straight.

Figure 3:
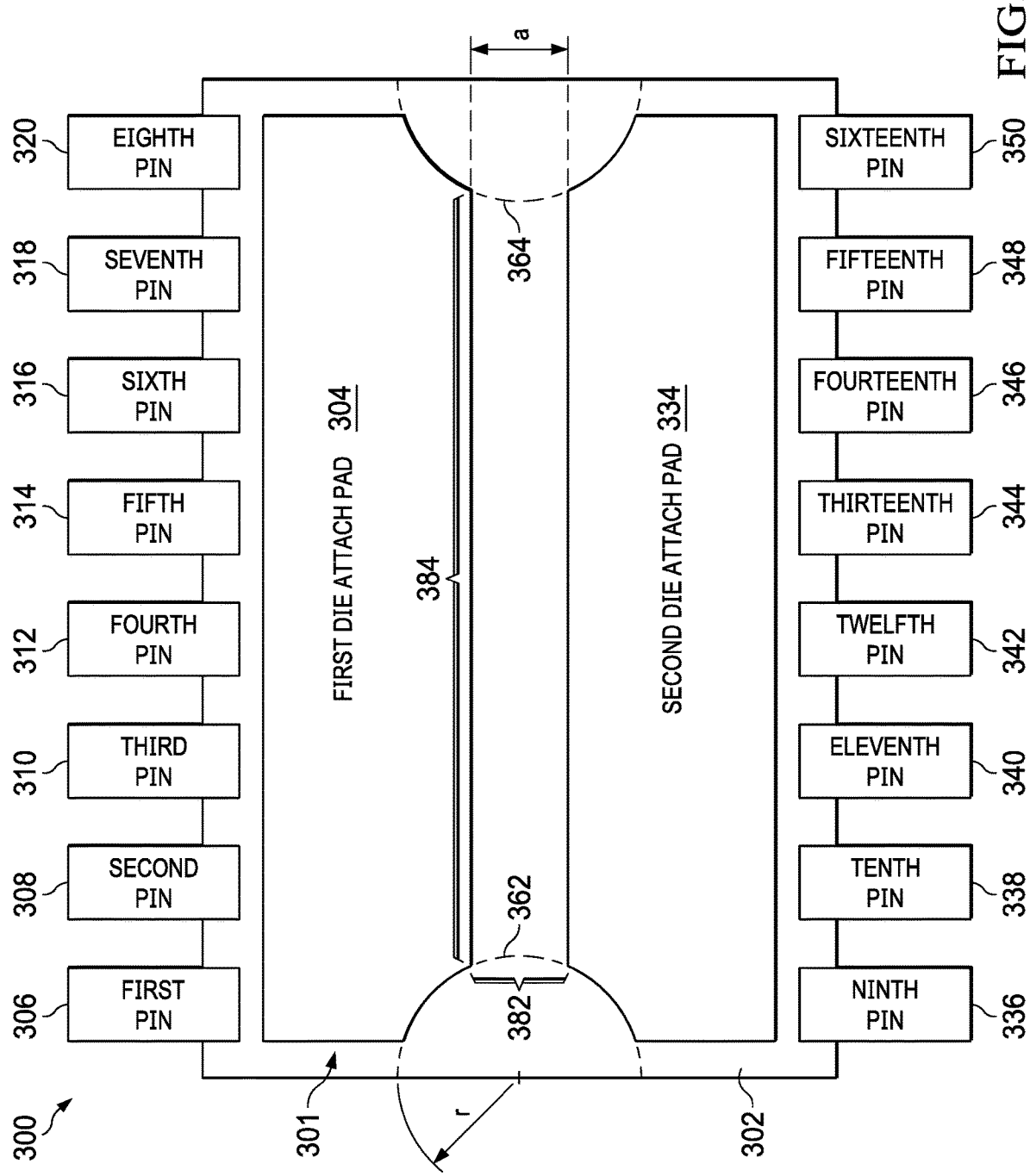
FIG. 3 is a diagram illustrating a cross section of another package for high voltage semiconductor devices.

Referring to FIG. 3, a diagram illustrating a cross section of another package 300 for high voltage semiconductor devices is shown. The cross section of the package 300 includes a lead frame 301 encased in a mold compound 302. The mold compound 302 may include epoxy resin, silicas, other components, or a combination thereof. The lead frame 301 includes a first die attach pad 304, a second die attach pad 334, a first plurality of pins 306-320, and a second plurality of pins 336-350. In the illustrated example, the first plurality of pins 306-320 includes a first pin 306, a second pin 308, a third pin 310, a fourth pin 312, a fifth pin 314, a sixth pin 316, a seventh pin 318, and an eighth pin 320. The second plurality of pins 336-350 includes a ninth pin 336, a tenth pin 338, an eleventh pin 340, a twelfth pin 342, a thirteenth pin 344, a fifteenth pin 348, and a sixteenth pin 350. Examples of material included in the lead frame 301 include copper (Cu), copper alloy, and other conductive materials.

The first die attach pad 304 and the second die attach pad 334 are separated by a gap 382. Further, a first exclusion zone 362 and a second exclusion zone 364 are formed in the package 300. The exclusion zones 362, 364 correspond to areas where no metal is included and may correspond to areas where portions of the die attach pads 304, 334 have been removed. As illustrated, the exclusion zones are semicircular and have radii of length "r". A volume of an electric field generated by a semiconductor device included in the package 300 may be based on a density of metal in the package 300. Increasing the radius "r" of the exclusion zones may decrease a volume of an electric field generated by a semiconductor device included the package 300.

The exclusion zones 362, 364 form parts of the gap 382. An intermediate portion 384 of the gap 382 has a width of "a" while the exclusion zones 362, 364 are larger than a. Accordingly, a first portion of the gap 382 (e.g., the first exclusion zone 362) and a second portion of the gap 382 (e.g., the second exclusion zone 364) are wider than an intermediate portion 384 of the gap 382. The mold compound 302 may fill the first portion of the gap 382, the second portion of the gap 382, and the intermediate portion 384 of the gap 382.

In operation, semiconductor devices attached to the die attach pads 304, 334 generate a three dimensional electric field. A volume of the electric field is influenced by a difference in voltage between the semiconductor devices. Further, the volume of the electric field is influenced by a density of metal (including that of the die attach pads 304, 334) between the two voltages. In general, the less dense the metal in a volume between the two voltages is, the smaller the electric field volume may be. Similarly, the larger the voltage difference is, the larger the electric field volume may be. Because, the gap 382 is wider in some areas (e.g., the exclusion zones 362, 364) than other areas, density of metal between voltages generated by devices attached to the die attach pads 304, 334 may be less as compared to in packages in which the gap 182 has a uniform width. Accordingly, an electric field generated by semiconductor devices included in the package 300 may have a smaller volume as compared to electric fields generated by similar semiconductor devices in other packages. Larger values of the radius r of the exclusion zones 362, 364 may result in smaller electric field volumes. Accordingly, the radius r of the exclusion zones 362, 364 may be selected by a semiconductor manufacturer based on a voltage difference of semiconductor devices included in the package 300 so that the electric field of the semiconductor devices does not leak out of the package 300.

Figure 4:
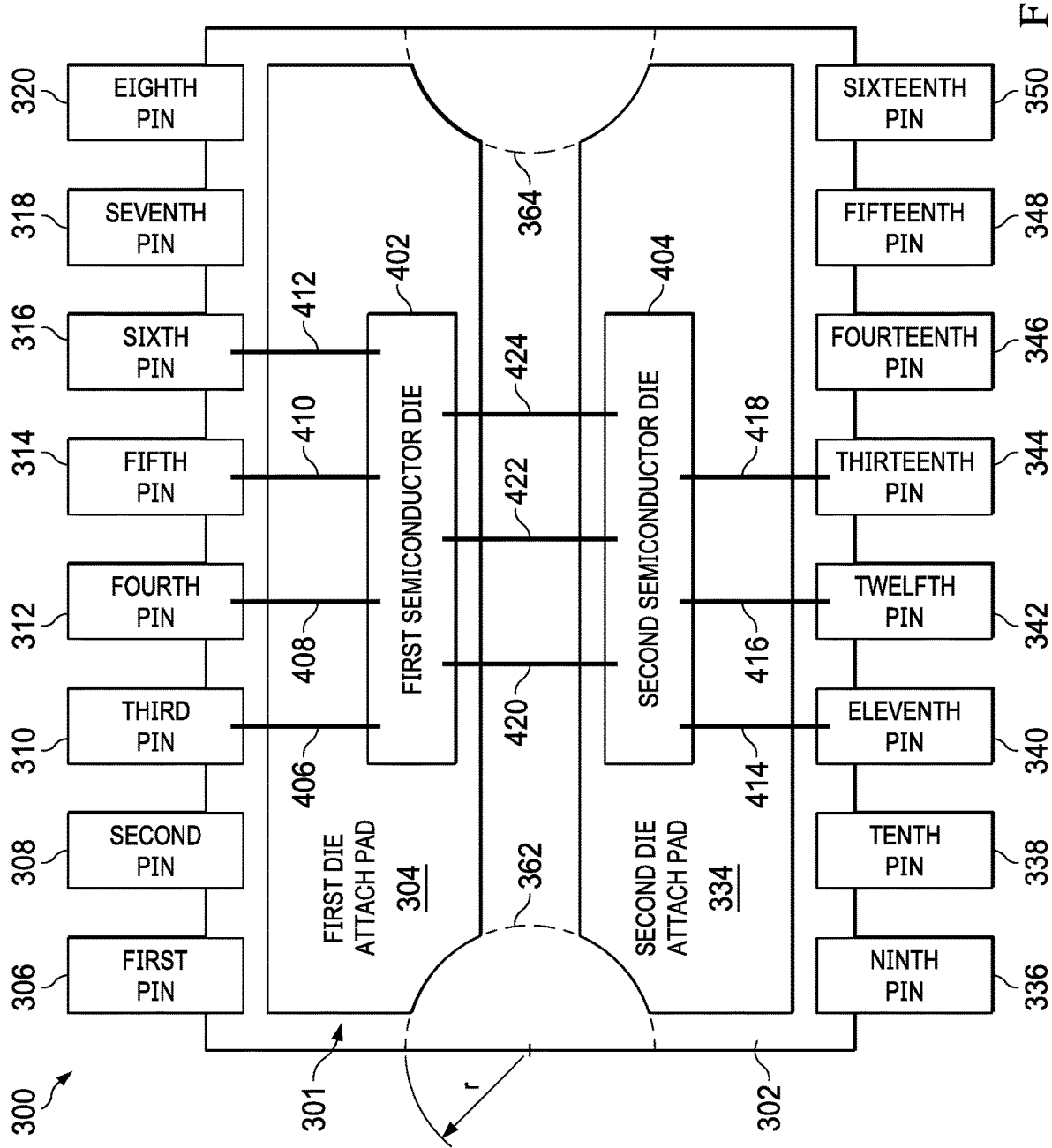
FIG. 4 is a diagram of another cross section of the package for high voltage semiconductor devices depicted in FIG. 3.

FIG. 4 illustrates another cross section of the package 300 illustrating a first semiconductor die 402 attached to the first die attach pad 304 and a second semiconductor die 404 attached to the second die attach pad 334. In some examples, a voltage difference between the first semiconductor die 402 and the second semiconductor device 404 is 6 kilovolts (kV). In other examples, a voltage difference between the first semiconductor die 402 and the second semiconductor device 404 is 8 kV. The semiconductor dies 402, 404 may be attached to the die attach pads 304, 334 using a conductive or insulating adhesive. The first semiconductor die 402 is coupled to the third pin 310 via a first bonding wire 406; to the fourth pin 312 via a second bonding wire 408; to the fifth pin 314 via a third bonding wire 410; to the sixth pin 316 via a fourth bonding wire 412. The second semiconductor die 404 is coupled to the eleventh pin 340 via a fifth bonding wire 414; to the twelfth pin 342 via a sixth bonding wire 416; and to the thirteenth pin 344 via a seventh bonding wire 418. Further, the first semiconductor die 402 and the second semiconductor die 404 are coupled to each other via an eighth bonding wire 420, a ninth bonding wire 422, and a tenth bonding wire 424. In other examples, the first semiconductor die 402 and/or the second semiconductor die 404 are coupled to a different combination of pins and/or the lead frame 301 includes a different number of pins than illustrated. Further, the semiconductor dies 402, 404 may be coupled to each other using a different number of bonding wires.

As explained above, the exclusion zones 362, 364 may decrease a metal density in opposing edges of the die attach pads 304, 334. Accordingly, an electric field generated by the semiconductor dies 402, 404 may have less volume as compared to an electric field generated by the semiconductor dies 402, 404 in another package. Therefore, the electric field of the semiconductor dies 402, 404 may not leak from the package 300 even when a voltage difference between the semiconductor dies 402, 404 is relatively high. Accordingly, the package 300 may be more suited for high voltage devices as compared to other types of packages.

Figure 5:
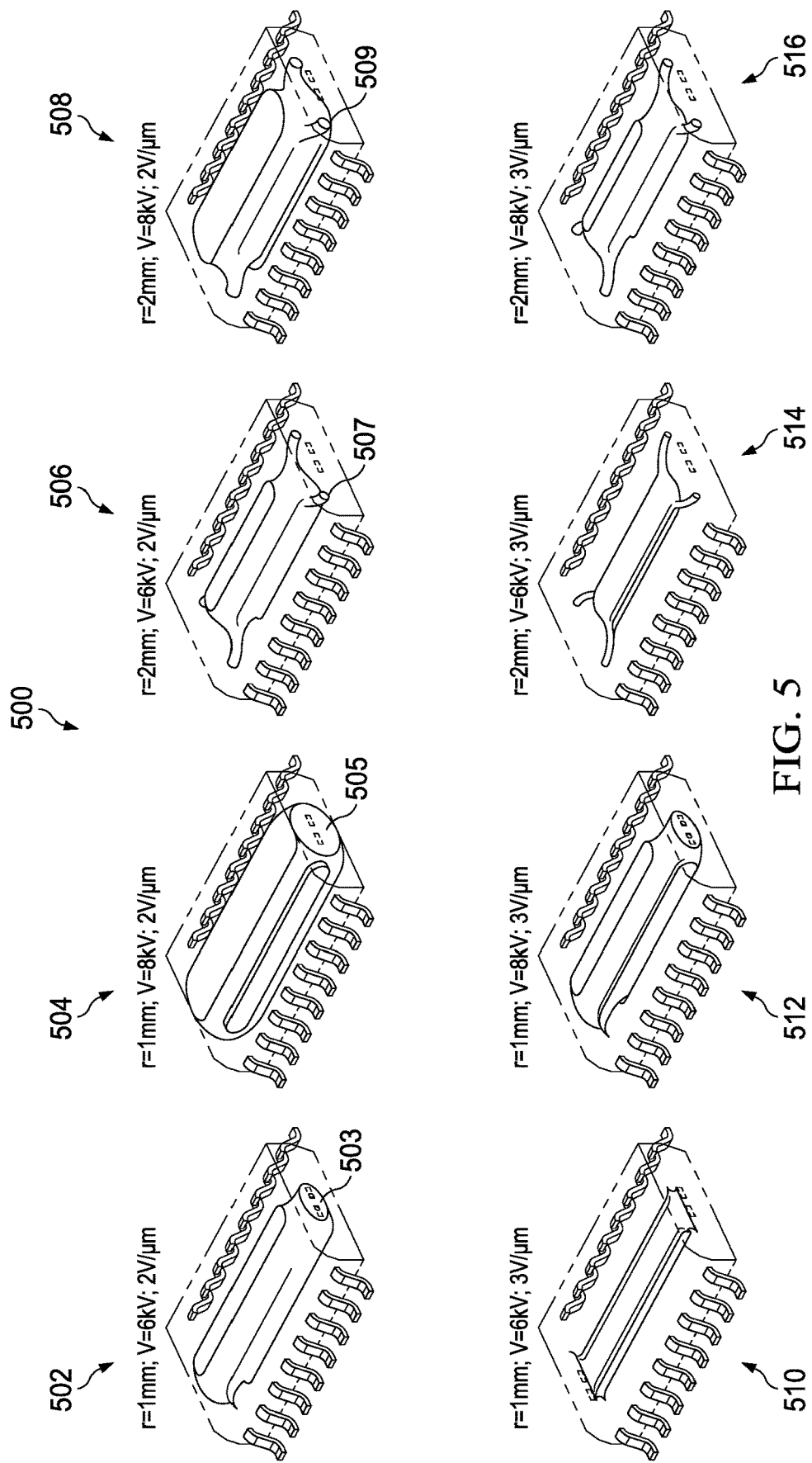
FIG. 5 is a chart illustrating models of electric fields generated by semiconductor devices in packages that have various sized exclusion zones.

FIG. 5 is a chart illustrating models 500 of electric fields generated by semiconductor devices in packages that have various sized exclusion zones. FIG. 5 depicts a model of a first example 502 in which the exclusion zones 362, 364 have a radius of 1 millimeter (mm), the semiconductor dies 402, 404 are configured to operate at a 6 kV, and a first electric field 503 generated by the semiconductor dies 402, 404 has a field strength of 2 volts per micrometer (V/μm). In comparison, a model of a second example 504 depicts a second electric field 505 generated by the semiconductor devices 402, 404 in examples in which the radius of the exclusion zones 362, 364 is 1 mm, the semiconductor dies 402, 404 are configured to operate at a 8 kV, and the field strength of the electric field 505 is 2 V/μm. As shown, a volume of the second electric field 505 is greater than a volume of the first electric field 503 due to an increase in voltage. However, third and fourth examples 506, 508 show that increasing the radius of the exclusion zones 362, 364 decreases electric field volume.

The third example 506 depicts a third electric field 507 generated by the semiconductor dies 402, 404 in examples in which the radius r of the exclusion zones 362, 364 is increased to 2 mm and the semiconductor dies 402, 404 are configured to operate at 6 kV and the third electric field has a field strength of 2 V/μm. As illustrated, the third electric field 507 has a volume smaller than a volume of the first electric field 503 despite the electric fields 503, 507 having a common field strength and both the examples 502, 506 depicting the semiconductor dies 402, 404 operating at 6 kV. Similarly, the fourth example 508 depicts a fourth electric field 509 having a volume that is smaller than the volume of the second electric field 505 despite the electric fields 505, 509 having a common field strength and both the examples 504, 508 depicting the semiconductor dies 402, 404 operating at 8 kV. Fifth, sixth, seventh, and eighth, examples 510, 512, 514, 516 show similar results for electric fields of field strength 3 V/μm.

Accordingly, FIG. 5 illustrates that decreasing metal density between voltage differences in a package by increasing a size of exclusion zones may decrease a volume of an electric field. Therefore, incorporating exclusion zones (e.g., portions of a gap between pads that are wider than other portions of the gap) may prevent an electric field from leaking outside of a package. Similarly, decreasing metal density between voltage differences in a package by thinning opposing edges of die attach pads of a lead frame, as depicted in FIG. 1 may decrease a volume of an electric field generated by semiconductor dies attached to the lead frame. Accordingly, thinning of edges of die attach pads may be determined by a semiconductor manufacturer based on a voltage difference of semiconductor devices included in a package so that the electric field of the semiconductor devices does not leak out of the package. Further, staggered edges on opposing edges of die attach pads, as shown in FIG. 2, may be employed to produce a similar effect.

Figure 6:
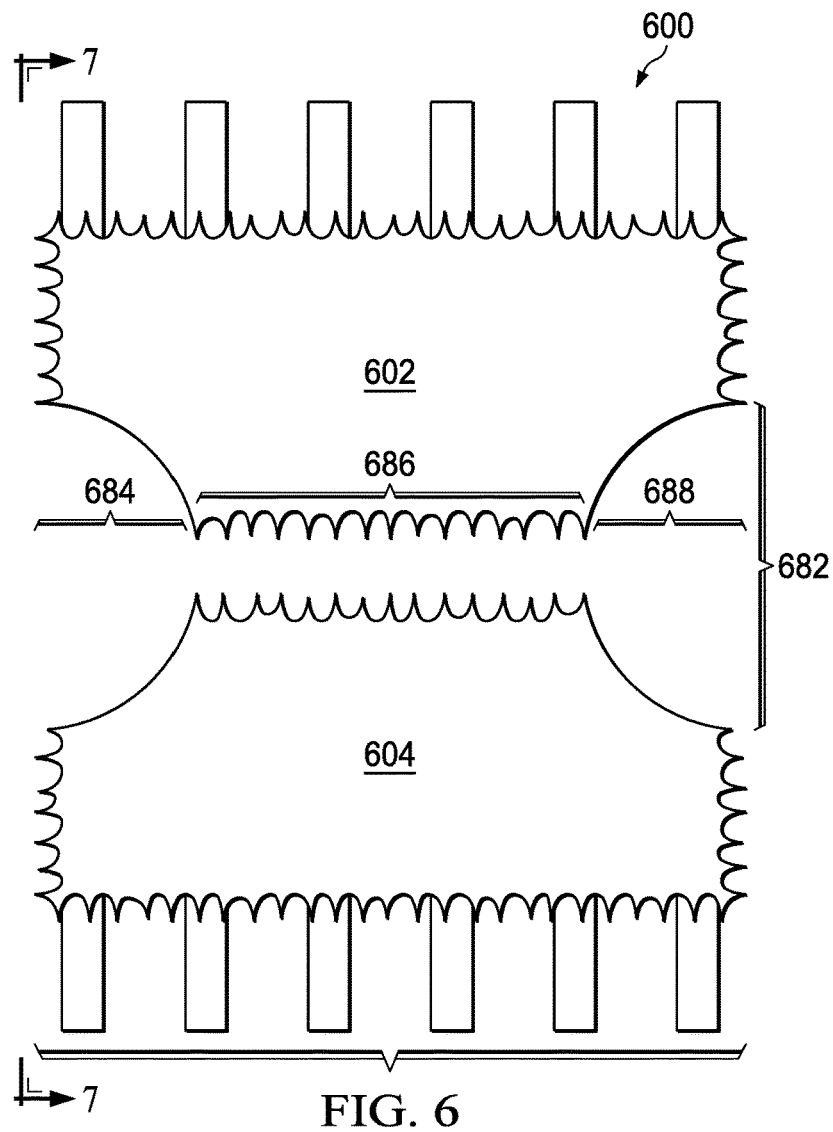
FIG. 6 is a diagram of a lead frame that combines characteristics of FIGS. 1, 2 and 3.
Figure 7:
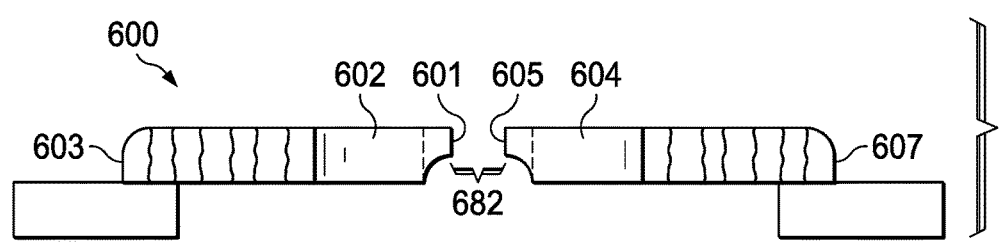
FIG. 7 is a profile view of the lead frame of FIG. 6.

Characteristics of the lead frames 116, 200, 301 described herein may be combined. For example, FIG. 6 illustrates a lead frame 600 in which a first die attachment pad 602 and a second die attachment pad 604 have staggered edges and a first portion 684 of a gap 682 and a second portion 688 of the gap 682 are wider than an intermediate portion 686 of the gap 682. FIG. 7 illustrates a profile view of the lead frame 600 showing that a first portion of the first die attach pad 602 is thinned relative a second portion of the first die attach pad 602 resulting in a first edge 601 of the first die attach pad 602 being thinner than a second edge 603 of the first die attach pad 602. Similarly, a first portion of the second die attach pad 604 is thinned relative to a second portion of the second die attach pad 604 resulting in a first edge 605 of the first die attach pad 604 being thinner than a second edge 607 of the second die attach pad 604.

Thus, FIGS. 6 and 7 illustrate a combination of various electric field controlling lead frame characteristics. Other combinations of the characteristics of the lead frames 116, 200, 301 described herein are possible.

Figure 9:
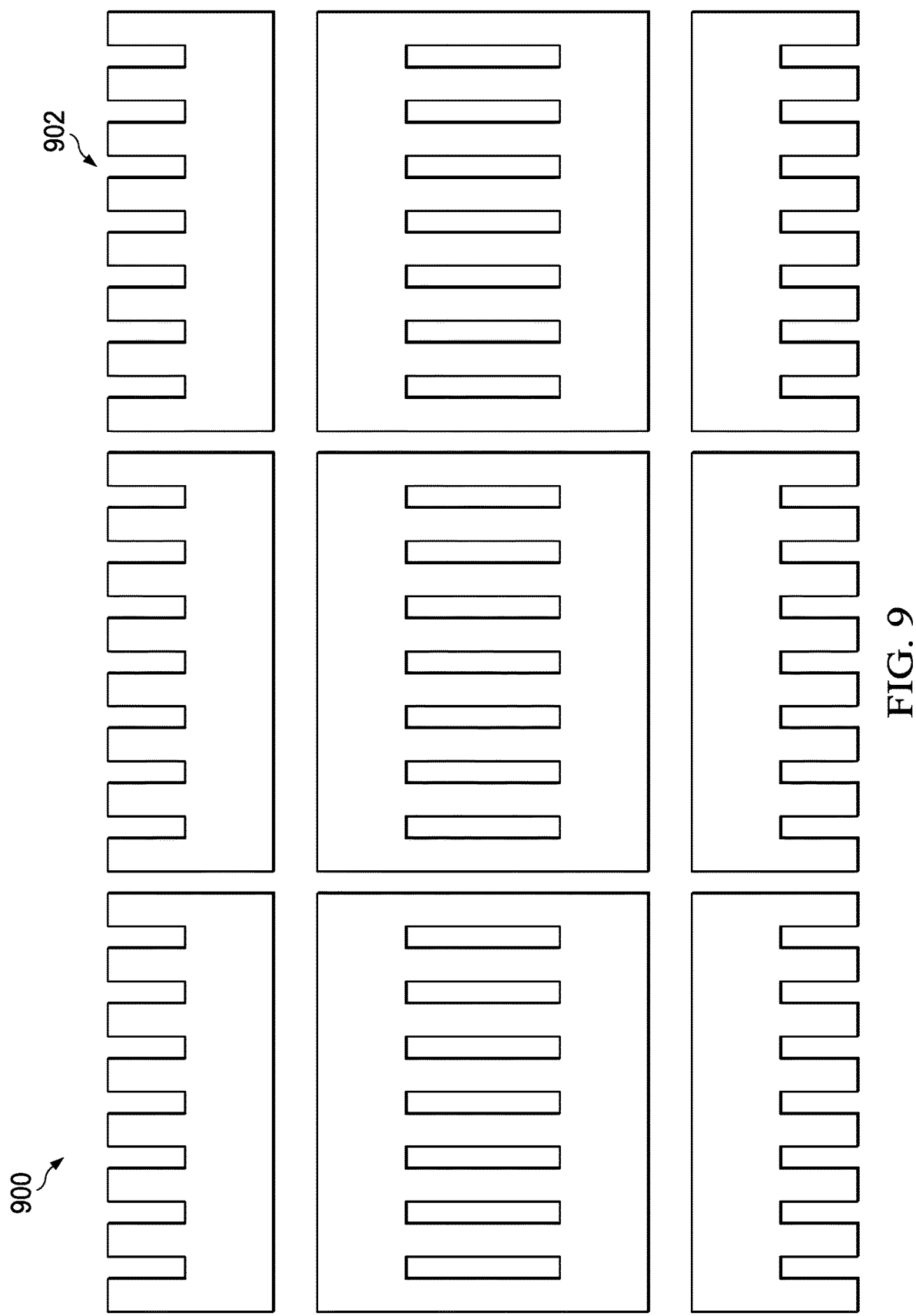
FIG. 9 is a diagram depicting a second stage of a process of manufacturing a package for high voltage semiconductor devices.

Referring to FIG. 8, an illustration depicting a first stage 800 of a process of manufacturing a package for high voltage semiconductor devices is shown. At the first stage 800, a sheet of metal 802 (e.g., Cu or a Cu alloy) is prepared for processing (e.g., by an automated foundry). FIG. 9 depicts a second stage 900 of the process of manufacturing the package for high voltage semiconductor devices. At the second stage, the sheet of metal 802 has been patterned into split pad lead frames 902. For example, an automated foundry may perform an etch or stamping process to form the split pad lead frames 902. As illustrated, some or all of the split pad lead 902 frames may be attached to each other at the stage 900.

Referring to FIGS. 10-13, additional stages 1000, 1100, 1300 of the process of manufacturing the package for high voltage semiconductor devices are shown. While depicted in the alternative, examples of the process may include any combination of the stages 1000, 1100, 1300. Further, the stages 1000, 1100, 1300 may vary from what is depicted based on whether one of other stages 1000, 1100, 1300 was performed prior.

Figure 10:
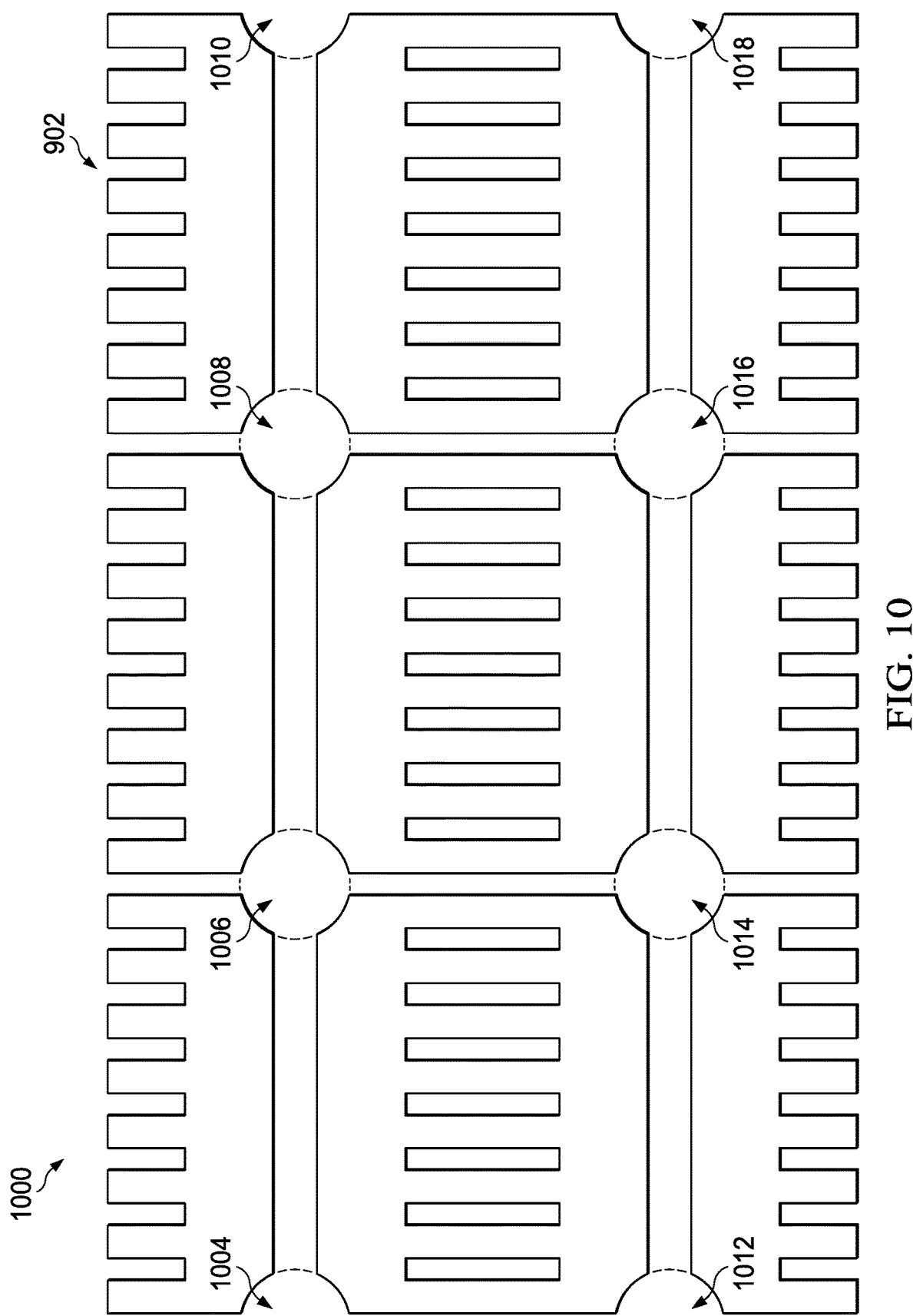
FIG. 10 is a diagram depicting a third stage of a process of manufacturing a package for high voltage semiconductor devices.

FIG. 10 depicts a third stage 1000, at which metal has been removed from the split pad lead frames 902 to create exclusion zones 1004, 1006, 1008, 1010, 1012, 1014, 1016, and 1018. These exclusion zones 1004, 1006, 1008, 1010, 1012, 1014, 1016, 1018 may correspond to the exclusion zones 362, 364 of FIG. 3. For example, the automated foundry may form the exclusion zones by performing an etching or stamping process on the split pad lead frames 902. In some examples, the third stage 1000 and the second stage 900 are not separate stages. For example, the automated foundry may create the exclusion zones 1004, 1006, 1008, 1010, 1012, 1014, 1016, 1018 using the same etch or stamping process used to create the split pad lead frames 902.

Figure 12:
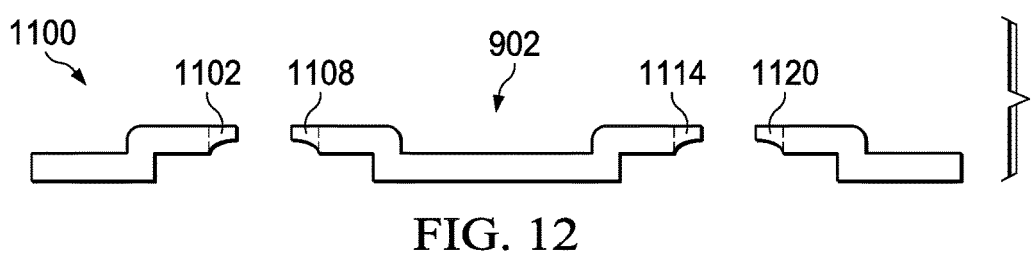
FIG. 12 is a diagram depicting a profile view of the fourth stage.
Figure 11:
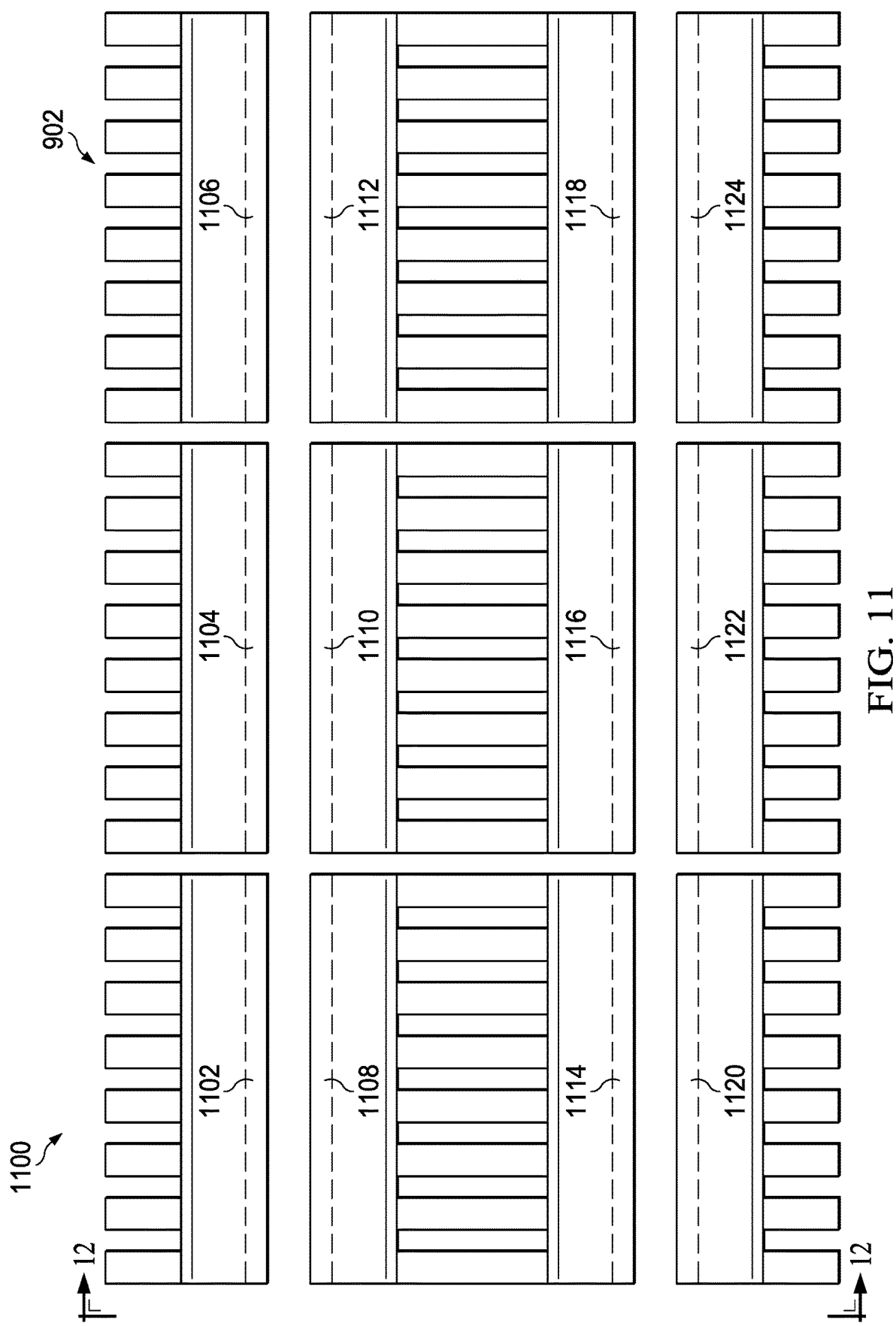
FIG. 11 is a diagram depicting a fourth stage of a process of manufacturing a package for high voltage semiconductor devices.

FIG. 11 depicts a fourth stage 1100 at which portions 1102, 1104, 1106, 1108, 1110, 1112, 1114, 1116, 1118, 1120, 1122, 1124 of the lead frames 902 have been thinned. For example, the automated foundry may perform a coining process or edging process to thin the portions 1102, 1104, 1106, 1108, 1110, 1112, 1114, 1116, 1118, 1120, 1122, 1124. Such a process may be used to thin the portions 114, 118 of FIG. 1. Coining results in plastic flow on a surface of a material. This plastic flow may reduce grain size in crystallite of metal on a surface of the portions 1102, 1104, 1106, 1108, 1110, 1112, 1114, 1116, 1118, 1120, 1122, 1124 as compared to other portions of the lead frames 902. This reduced grain size may result in a harder material on a surface of the portions 1102, 1104, 1106, 1108, 1110, 1112, 1114, 1116, 1118, 1120, 1122, 1124 relative to other areas of the lead frames 902 while an interiors of the portions 1102, 1104, 1106, 1108, 1110, 1112, 1114, 1116, 1118, 1120, 1122, 1124 maintains ductility of the other areas. FIG. 12 depicts a profile view of the lead frames 902 at the fourth stage 1100.

Figure 13:
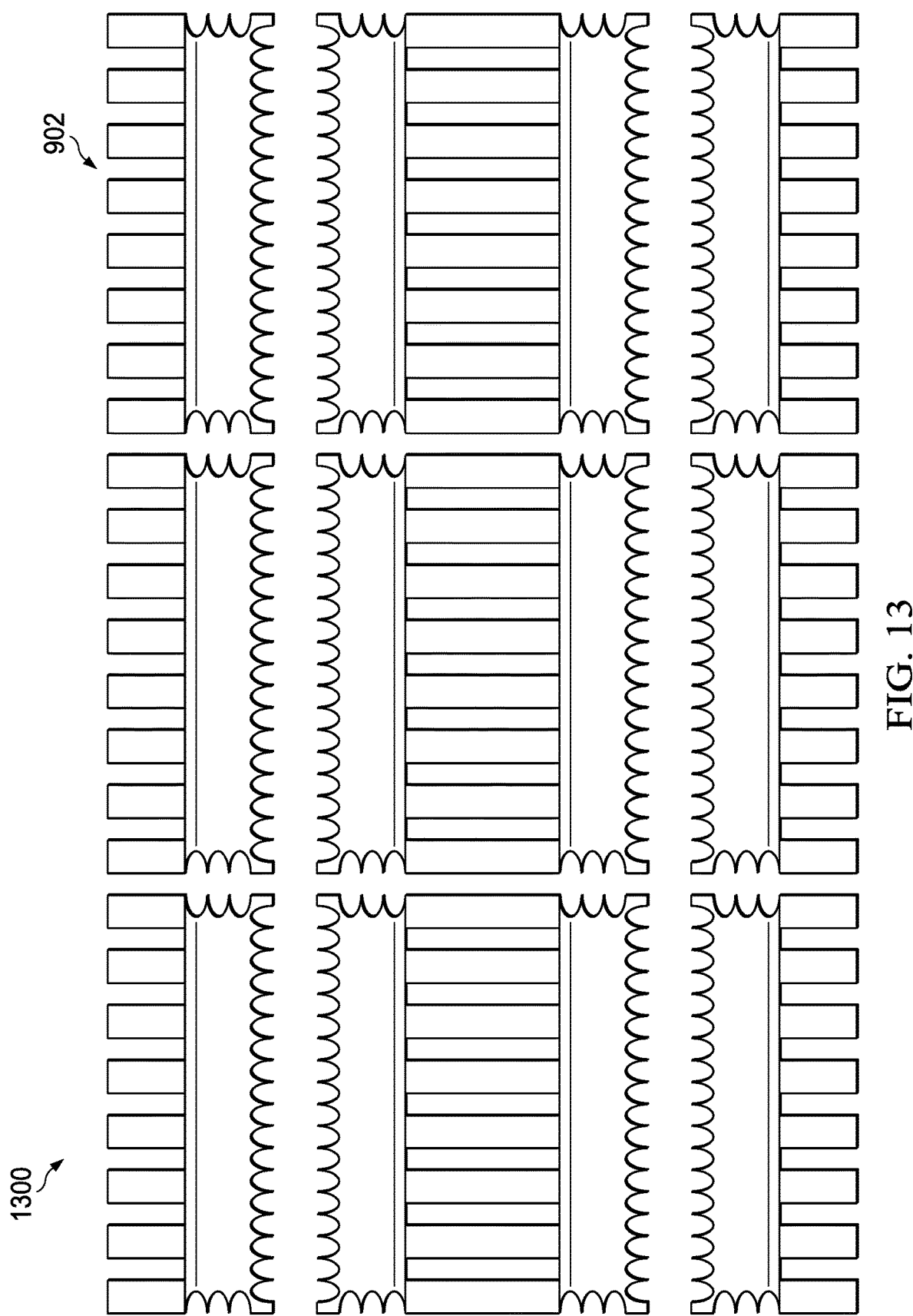
FIG. 13 is a diagram depicting a fifth stage of a process of manufacturing a package for high voltage semiconductor devices.

FIG. 13 depicts a fifth stage 1300, at which staggered edges have been formed on the lead frames 902. Such staggered edges may correspond to the protrusions 206, 208 of FIG. 2. For example, the automated foundry may perform an etching process or stamping process to create the staggered edges. In some examples, the fifth stage 1300 and the second stage 900 are not separate stages. For example, the automated foundry may create the staggered edges using the same etch or stamping process used to create the split pad lead frames 902.

Figure 14:
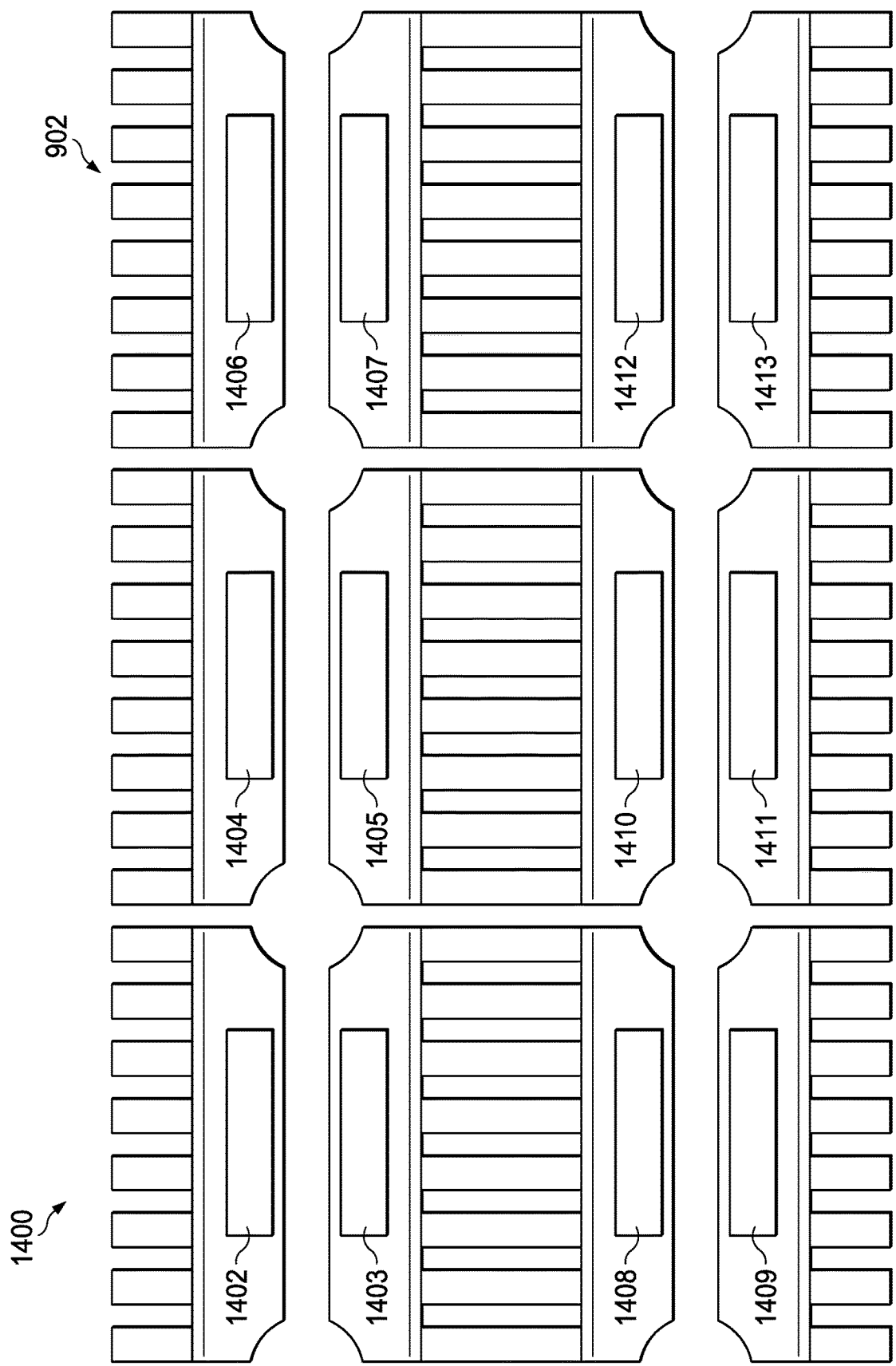
FIG. 14 is a diagram depicting a sixth stage of a process of manufacturing a package for high voltage semiconductor devices.

Referring to FIG. 14, a sixth stage 1400 of the process of manufacturing a package for high voltage semiconductor devices is shown. While depicted as following the third stage 1000, the sixth stage 1400 may follow any combination not the third stage 1000, the fourth stage 1100, and the fifth stage 1300. At the sixth stage 1400, dies 1402, 1403, 1404, 1405, 1406, 1407, 1408, 1409, 1410, 1411, 1412, 1413 have been added to the split pad lead frames 902. For example, the automated foundry may attach the dies 1402, 1403, 1404, 1405, 1406, 1407, 1408, 1409, 1410, 1411, 1412, 1413 to the lead frames 902 using a conducting or nonconducting adhesive. Any of the dies 1402, 1403, 1404, 1405, 1406, 1407, 1408, 1409, 1410, 1411, 1412, 1413 may correspond to the semiconductor dies 402, 404 or the semiconductor dies 104, 105.

Figure 15:
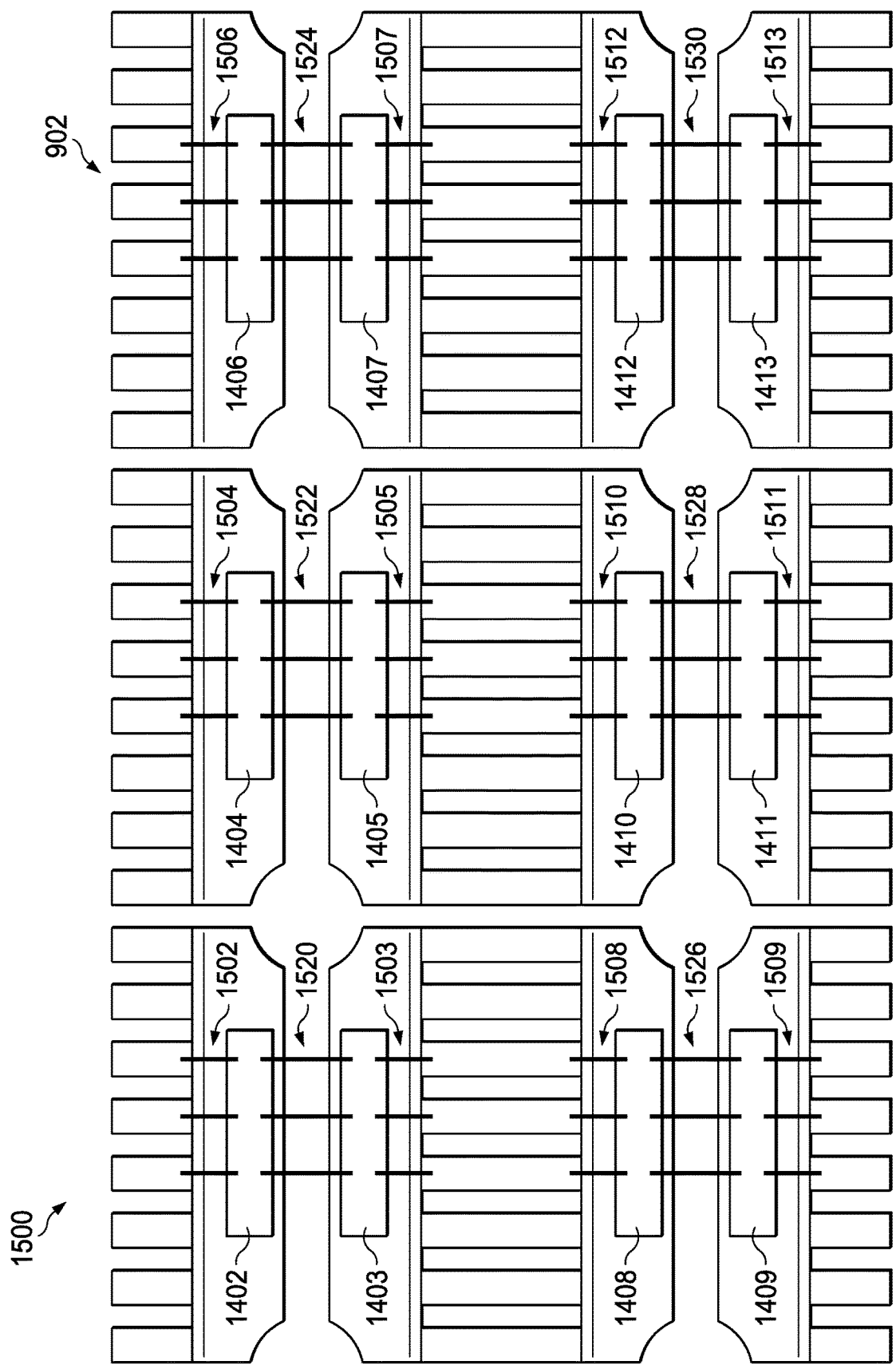
FIG. 15 is a diagram depicting a seventh stage of a process of manufacturing a package for high voltage semiconductor devices.

Referring to FIG. 15, a seventh stage 1500 of the process of manufacturing a package for high voltage semiconductor devices is shown. At the seventh stage 1500, wire bonds 1502, 1503, 1504, 1505, 1506, 1507, 1508, 1509, 1510, 1511, 1512, 1513 between the split pad lead frames 902 and the dies 1402, 1403, 1404, 1405, 1406, 1407, 1408, 1409, 1410, 1411, 1412, 1413 have been added. Further, wire bonds 1520, 1522, 1524, 1526, 1528, 1530 have been added between the dies 1402, 1403, 1404, 1405, 1406, 1407, 1408, 1409, 1410, 1411, 1412, 1413. For example, the automated foundry may attach the wire bonds 1502, 1503, 1504, 1505, 1506, 1507, 1508, 1509, 1510, 1511, 1512, 1513, 1520, 1522, 1524, 1526, 1528, 1530 via a ball bonding technique, a wedge bonding technique, or a compliant bonding technique.

Figure 16:
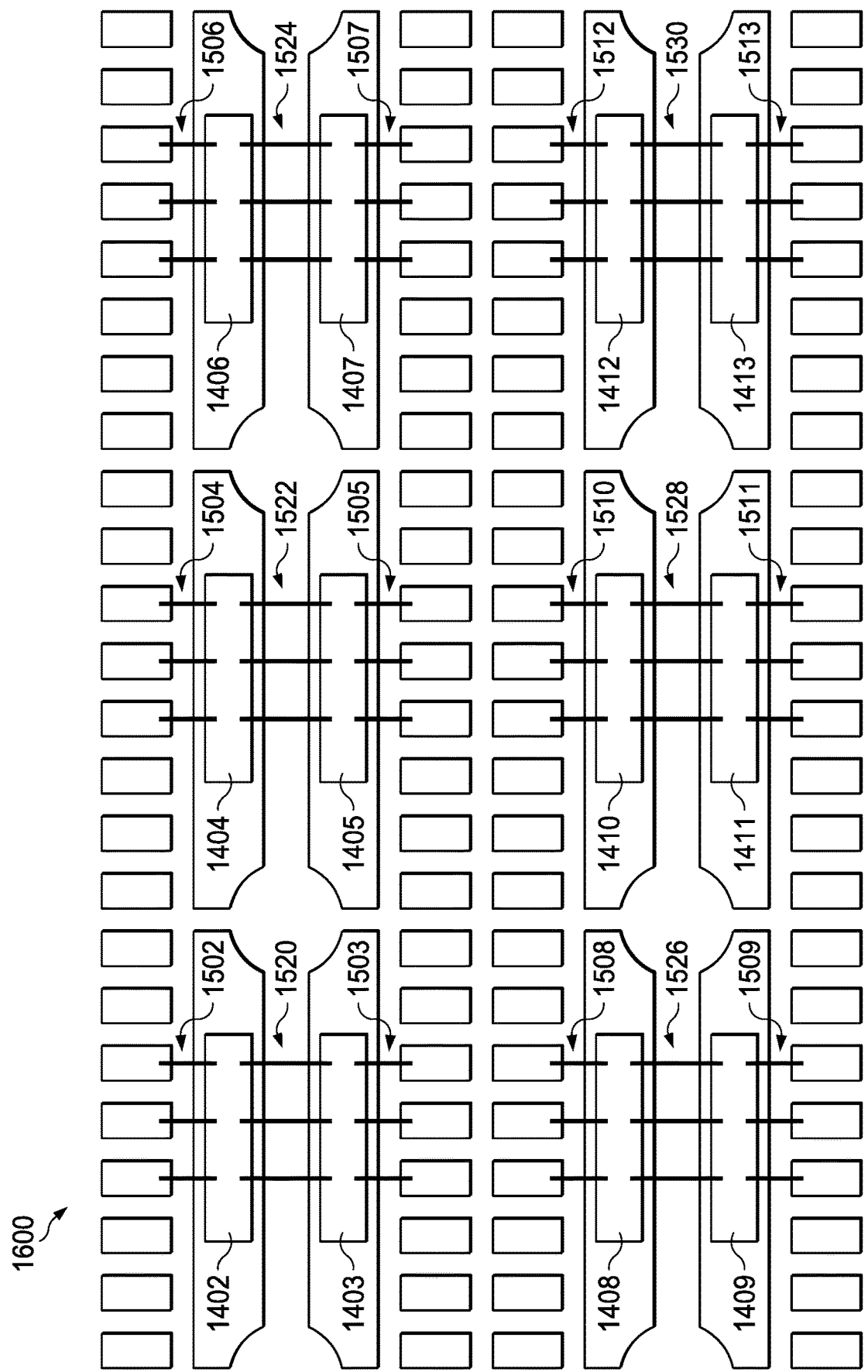
FIG. 16 is a diagram depicting an eighth stage of a process of manufacturing a package for high voltage semiconductor devices.

Referring to FIG. 16, an eighth stage 1600 of the process of manufacturing a package for high voltage semiconductor devices is shown. At the eighth stage 1600, the split pad lead frames 902 have been divided into individual lead frames and pads of the lead frames have been separated from pins.

Figure 17:
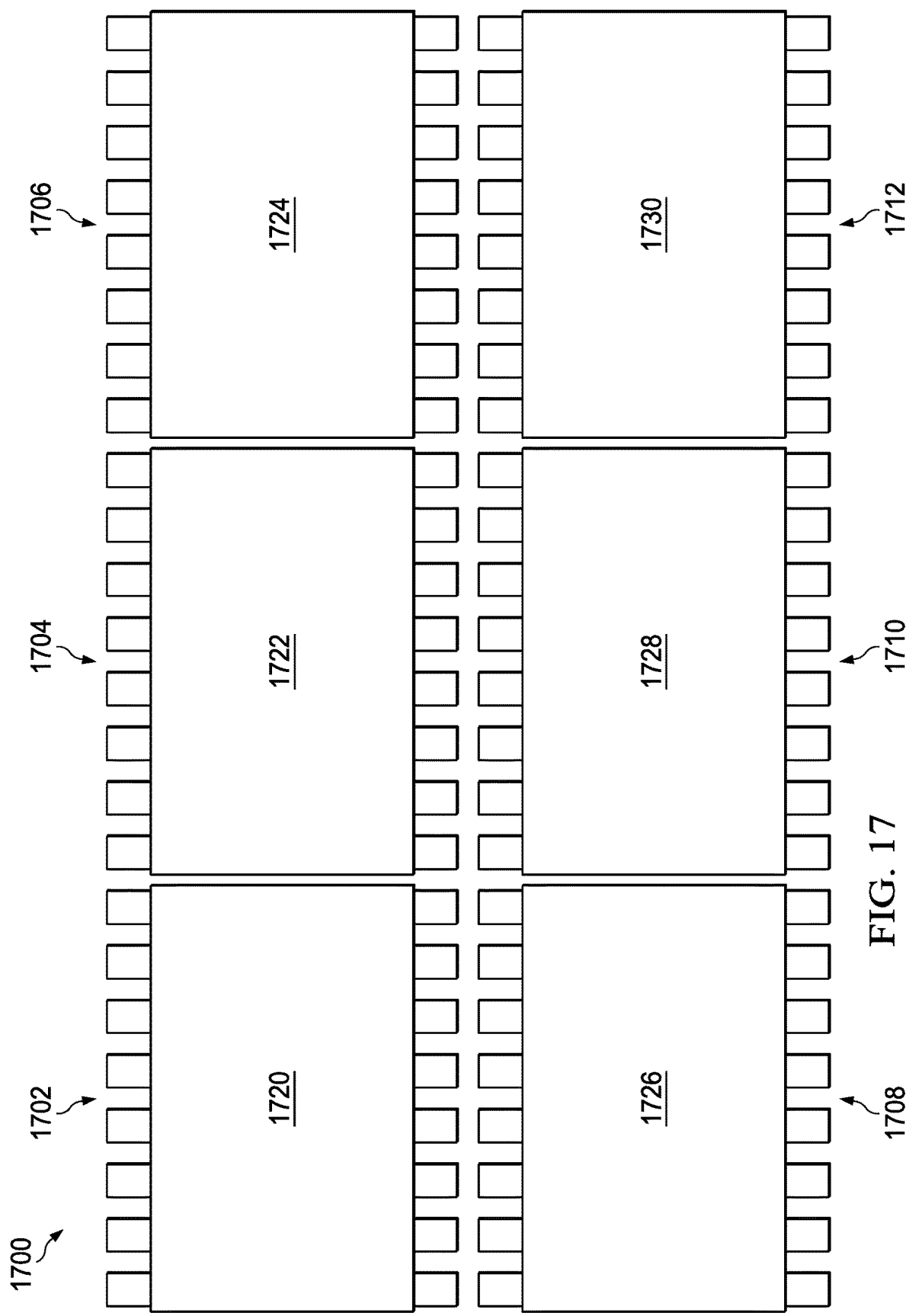
FIG. 17 is a diagram depicting a ninth stage of a process of manufacturing a package for high voltage semiconductor devices.

Referring to FIG. 17, a ninth stage 1700 of the process of manufacturing a package for high voltage semiconductor devices is shown. At the ninth stage 1700, mold compound 1720, 1722, 1724, 1726, 1728, 1730 has covered the split pad lead frames 902 to form packages 1702, 1704, 1706, 1708, 1710, 1712. For example, the automated foundry may inject the mold compound using an injection molding technique.

Any of the packages 1702, 1704, 1706, 1708, 1710, 1712 may correspond to the package 300. Further, examples of the process that include the fourth stage 1100 may result in the package 100. In addition, examples of the process that include the fifth stage 1300 may result in a package that includes the lead frame 200. Further, examples of the process may include combinations of the stages 1000, 1100, 1300 resulting in packages that include lead frames, such as the lead frame 600, that include characteristics of more than one of the lead frame 301, the lead frame 116, and the lead frame 200. Thus, the process illustrated in FIGS. 8-17 may be used to fabricate high voltage semiconductor packages.

Figure 18:
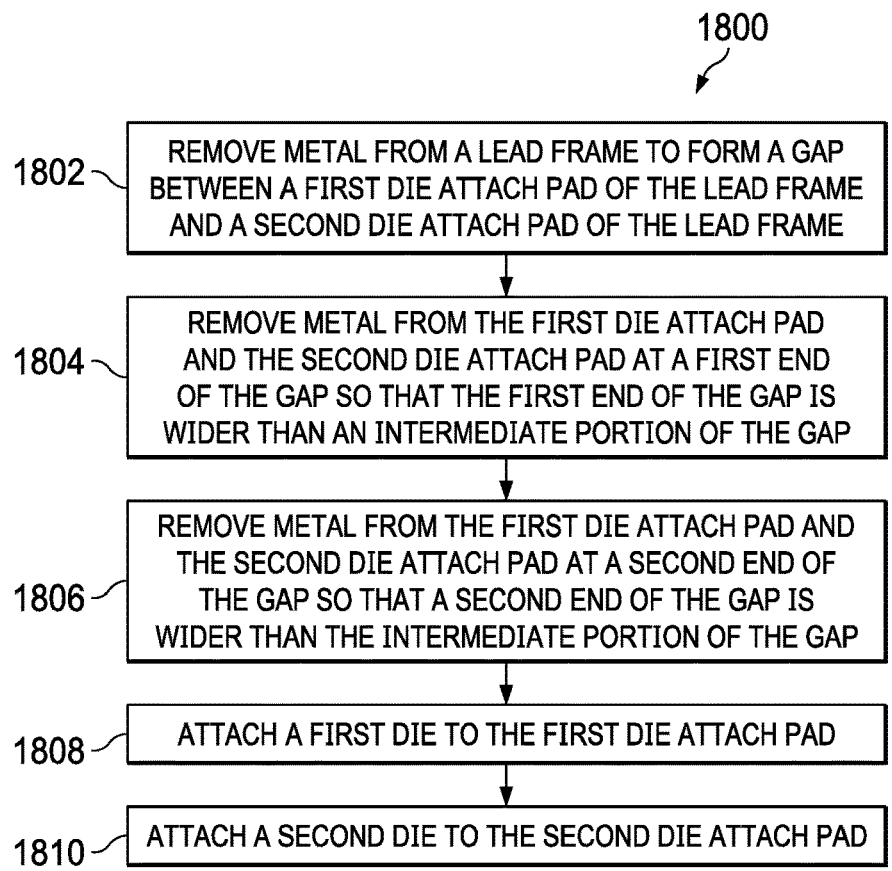
FIG. 18 is a flowchart depicting a method of manufacturing a package for high voltage semiconductor devices.

Referring to FIG. 18, a flowchart illustrating a method 1800 of fabricating a package for high voltage semiconductor devices. The method 1800 may be performed by an automated foundry. The method 1800 includes removing metal from a lead frame to form a gap between a first die attach pad of the lead frame and a second die attach pad of the lead frame, at 1802. For example, the automated foundry may form the gap 382 between the first die attach pad 304 and the second die attach pad 334 using an etch or a stamp process.

The method 1800 further includes removing metal from the first die attach pad and the second die attach pad at a first end of the gap so that the first end of the gap is wider than an intermediate portion of the gap, at 1804. For example, the automated foundry may remove metal from the first die attach pad 304 and the second die attach pad 334 to create the first exclusion zone 362. The first exclusion zone 362 widens a first portion of the gap 382 so that the first portion is wider than the intermediate portion 384 of the gap 382.

The method 1800 further includes removing metal from the first die attach pad and the second die attach pad at a second end of the gap so that a second end of the gap is wider than the intermediate portion of the gap, at 1806. For example, the automated foundry may remove metal from the first die attach pad 304 and the second die attach pad 334 to create the second exclusion zone 364. The second exclusion zone 364 widens a second portion of the gap 382 so that the second portion is wider than the intermediate portion 384 of the gap 382.

The method 1800 further includes attaching a first die to the first die attach pad, at 1808. For example, the automated foundry may attach the first semiconductor die 402 to the first die attach pad 304.

The method 1800 further includes attaching a second die to the second die attach pad, at 1810. For example, the automated foundry may attach the second semiconductor die 404 to the second die attach pad 334.

Thus, the method 1800 may be used to create the package 300. The method 1800 may be modified to create the package 100 (e.g., by replacing steps 1804 and 1806 with edge thinning steps as depicted in FIG. 11). Similarly, the method 1800 may be modified to create a package including the lead frame 200 (e.g., by replacing the steps 1804 and 1806 with staggered edge forming steps as shown in FIG. 13). Further, the method 1800 may be modified to produce a package including a lead frame that has characteristics of more than one of the lead frames 116, 200, 301 of FIGS. 1-3 as shown in FIG. 6. Accordingly, the method 1800 may be used to fabricate a package for high voltage semiconductor devices.

Figure 19:
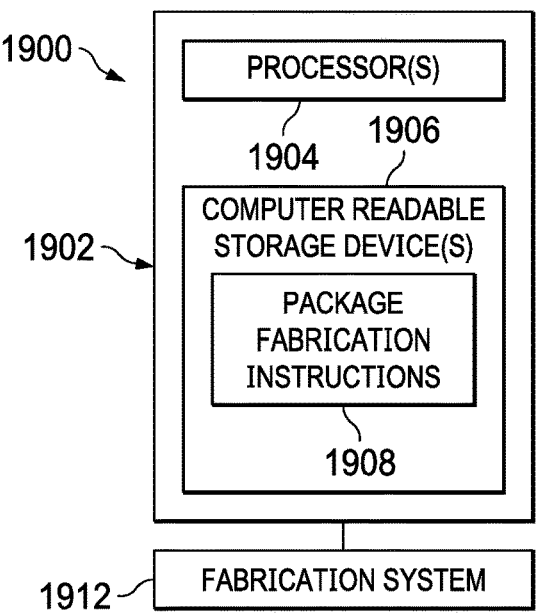
FIG. 19 is a diagram of a system for manufacturing a package for high voltage semiconductor devices.

Referring to FIG. 19, a diagram illustrating a system 1900 for fabrication of a package for high voltage semiconductor devices is shown. The system 1900 includes a computing device 1902. The computing device includes one or more processors 1904 and one or more computer readable storage devices 1906. The one or more processors 1904 may correspond to central processor units (CPUs) or other types of processors. The one or more computer readable storage devices 1902 may include read only memory, random access memory, or any other type of computer memory device. As used herein, a computer readable storage device is an article of manufacture and is not a signal.

The computing device 1902 is coupled to a fabrication system 1912, such as an automated foundry. The one or more computer readable storage devices store package fabrication instructions 1908 executable by the one or more processors 1904 to cause the fabrication system 1912 to perform any of the methods or processes described herein and/or to fabricate any of the devices described herein. Thus, the system 1900 may be used to fabricate a package for high voltage semiconductor devices.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. An apparatus comprising:
a first die attach pad;
a first die attached to the first die attach pad;
a second die attach pad;
a second die attached to the second die attach pad, wherein:
the first die attach pad and the second die attach pad are separated by a gap, wherein a first edge of the first die attach pad adjacent to the gap is thinner than a second edge of the first die attach pad, the first edge of the first die attach pad opposite the second edge of the first die attach pad;
a first edge of the second die attach pad adjacent to the gap is thinner than a second edge of the second die attach pad, the first edge of the second die attach pad opposite the second edge of the second die attach pad; and
a first portion of the gap is wider than a second portion of the gap from a top view of the apparatus.

2. The apparatus of claim 1, wherein the first portion of the gap is semicircular.

3. The apparatus of claim 1, further comprising bonding wires connecting the first die to the second die.

4. The apparatus of claim 1, further comprising mold compound that covers the first die attach pad, the second die attach pad, the first die, and the second die.

5. The apparatus of claim 4, wherein the mold compound fills the gap between the first die attach pad and the second die attach pad.

6. The apparatus of claim 1, wherein a thickness of the first edge of the first die attach pad is 50% a thickness of the second edge of the first die attach pad.

7. The apparatus of claim 1, wherein the first die attach pad and the second die attach pad have edges that include a plurality of protrusions.

8. The apparatus of claim 1, wherein a voltage difference between the first die and the second die is 8 kilovolts.

9. The apparatus of claim 1, wherein a voltage difference between the first die and the second die is 6 kilovolts.

10. An apparatus comprising:
a first die attach pad;
a first die attached to the first die attach pad;
a second die attach pad;
a second die attached to the second die attach pad, wherein:
the first die attach pad and the second die attach pad are separated by a gap;
a first edge of the first die attach pad adjacent to the gap is coined;
a second edge of the second die attach pad adjacent to the gap is coined; and
a first portion of the gap is wider than a second portion of the gap from a top view of the apparatus.

11. The apparatus of claim 10, wherein the first portion of the gap is semicircular.

12. The apparatus of claim 10, wherein a thickness of the first edge of the first die attach pad is 50% a thickness of a remaining portion of the first die attach pad.

13. The apparatus of claim 10, further comprising a mold compound that covers the first die attach pad, the second die attach pad, the first die, and the second die.

14. A semiconductor package comprising:
- a first die attach pad;
- a second die attach pad;
- a first semiconductor die attached to the first die attach pad;
- a second semiconductor die attached to the second die attach pad, the first semiconductor die electrically coupled to the second semiconductor die, each of the first die attach pad and the second die attach pad including a first edge and a second edge, the first edge thinner than the second edge;
- at least a first lead electronically connected to the first semiconductor die; and
- at least a second lead electronically connected to the second semiconductor die.

15. The semiconductor package of claim 14, wherein the first edges of each of the first die attach pad and the second die attach pad face each other.

16. The semiconductor package of claim 14, further comprising molding compound covering portions of the first semiconductor die, the second semiconductor die, the first die attach pad, the second die attach pad, the first lead, and the second lead.

17. The semiconductor package of claim 14, wherein the semiconductor package is an isolation device, wherein operating voltages between the first semiconductor die and the second semiconductor die are different.

* * * * *